(12) United States Patent
Cheng et al.

(10) Patent No.: US 11,740,669 B2
(45) Date of Patent: Aug. 29, 2023

(54) ELECTRONIC APPARATUS HAVING IMMERSION COOLING SYSTEM AND OPERATING METHOD THEREOF

(71) Applicant: Wiwynn Corporation, New Taipei (TW)

(72) Inventors: Yi Cheng, New Taipei (TW); Chun-Wei Lin, New Taipei (TW); Tsung-Han Li, New Taipei (TW); Ting-Yu Pai, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 127 days.

(21) Appl. No.: 17/392,262

(22) Filed: Aug. 3, 2021

(65) Prior Publication Data
US 2022/0361357 A1  Nov. 10, 2022

(30) Foreign Application Priority Data
May 7, 2021 (TW) .................. 110116493

(51) Int. Cl.
*G06F 1/20* (2006.01)
*H05K 7/20* (2006.01)

(52) U.S. Cl.
CPC ......... *G06F 1/206* (2013.01); *H05K 7/20836* (2013.01)

(58) Field of Classification Search
CPC .................................................. G06F 1/206
See application file for complete search history.

(56) References Cited

U.S. PATENT DOCUMENTS

| 8,619,425 B2 | 12/2013 | Campbell et al. |
| 2013/0105120 A1 | 5/2013 | Campbell et al. |
| 2015/0062806 A1 | 3/2015 | Shelnutt et al. |
| 2017/0325355 A1* | 11/2017 | Lau .................... H05K 7/20318 |
| 2018/0042138 A1* | 2/2018 | Campbell .............. H05K 7/203 |

(Continued)

FOREIGN PATENT DOCUMENTS

| CN | 111478158 | 7/2020 |
| JP | 2018048757 | 3/2018 |

(Continued)

OTHER PUBLICATIONS

"Office Action of Taiwan Counterpart Application", dated Oct. 3, 2022, p. 1-p. 14.

(Continued)

*Primary Examiner* — Suresh Suryawanshi
(74) *Attorney, Agent, or Firm* — JCIPRNET

(57) ABSTRACT

An electronic apparatus including at least one heat generating component and an immersion cooling system is provided. The immersion cooling system includes a box body and a condensation module. The box body is adapted to accommodate a coolant, and the heat generating component is disposed in the box body to be immersed in the coolant in a liquid state. The condensation module includes a pipeline and a condensate, and the pipeline passes through the box body and is adapted for the condensate to flow. At least one parameter of the condensate may be changed to lower a boiling point of the coolant to a predetermined value by lowering the temperature in the box body with the condensate. In addition, an operating method of the electronic apparatus is also provided.

17 Claims, 8 Drawing Sheets

(56) References Cited

U.S. PATENT DOCUMENTS

| | | | | |
|---|---|---|---|---|
| 2018/0092243 A1* | 3/2018 | Saito | ............. | G06F 1/206 |
| 2019/0159359 A1* | 5/2019 | Tung | ............. | H05K 7/203 |
| 2019/0357379 A1 | 11/2019 | Kolar | | |
| 2020/0305307 A1* | 9/2020 | Amos | ............. | H01L 23/3677 |
| 2020/0315059 A1* | 10/2020 | Gao | ............. | H05K 7/20836 |
| 2022/0248559 A1* | 8/2022 | Peterson | ............. | H05K 7/20336 |
| 2022/0256744 A1* | 8/2022 | Le | ............. | H05K 7/20318 |
| 2022/0312644 A1* | 9/2022 | Shao | ............. | H05K 7/20272 |

FOREIGN PATENT DOCUMENTS

| | | |
|---|---|---|
| TW | 202020385 | 6/2020 |
| WO | 2021065017 | 4/2021 |

OTHER PUBLICATIONS

"Search Report of Europe Counterpart Application", dated Sep. 8, 2022, p. 1-p. 9.

* cited by examiner

ELECTRONIC APPARATUS HAVING IMMERSION COOLING SYSTEM AND OPERATING METHOD THEREOF

CROSS-REFERENCE TO RELATED APPLICATION

This application claims the priority benefit of Taiwan application serial no. 110116493, filed on May 7, 2021. The entirety of the above-mentioned patent application is hereby incorporated by reference herein and made a part of this specification.

BACKGROUND

Technical Field

The disclosure relates to a cooling system, an electronic apparatus having the same, and an operating method thereof, and more particularly to an immersion cooling system, an electronic apparatus having the same, and an operating method thereof.

Description of Related Art

With the rapid development of server performance, high-performance servers generate a lot of waste heat. In order to avoid the accumulation of waste heat causing poor operation of the host, some servers are designed to immerse the motherboard in liquid coolant which absorbs the heat generated by the heat generating elements of the motherboard and vaporizes and condenses on condensation pipelines. Droplets of the liquid coolant on the condensation pipelines fall back into the liquid coolant by gravity, achieving the effect of heat dissipation with this circulation, which is called two-phase immersion cooling technology in the industry. However, the liquid coolant is usually expensive. As the server performance continues to improve, heat dissipation requirements of the servers increase significantly. Replacing the liquid coolant for this reason may increase the operating cost of the servers. In addition, if pressure in a space for accommodating the liquid coolant is high, the liquid coolant is prone to diffuse outside after vaporization, which increases the maintenance cost of the servers.

SUMMARY

The disclosure provides an immersion cooling system, an electronic apparatus having the same, and an operating method thereof, which may improve thermal energy dissipation capability of a coolant.

The immersion cooling system of the disclosure includes a box body and a condensation module. The box body is adapted to accommodate a coolant. The condensation module drives a condensate and adjusts at least one parameter of the condensate to lower the temperature in the box body.

In an embodiment of the disclosure, the parameter is a flow rate of the condensate.

In an embodiment of the disclosure, the parameter is an initial temperature of the condensate.

In an embodiment of the disclosure, the parameter is a type of condensate.

In an embodiment of the disclosure, the immersion cooling system further includes a pressure control module. The pressure control module includes a heating unit and a pressure relief valve. The heating unit is adapted to heat the coolant in the box body for releasing an air dissolved in the liquid coolant from the liquid coolant. The valve is adapted to discharge the released air out of the box body.

In an embodiment of the disclosure, the pressure control module includes a gas detection unit. The gas detection unit is disposed out of the box body and corresponds to the pressure relief valve. Closing of the pressure relief valve corresponds to detecting the gaseous coolant by the gas detection unit.

In an embodiment of the disclosure, the condensation module includes a pipeline and a condensate. The pipeline passes through the box body and is adapted for the condensate to flow.

In an embodiment of the disclosure, the condensation module lowers the boiling point of the coolant to a predetermined value by lowering the temperature in the box body with the condensate.

The electronic apparatus of the disclosure includes at least one heat generating component and an immersion cooling system. The immersion cooling system includes a box body and a condensation module. The box body is adapted to accommodate a coolant. The heat generating component is disposed in the box body to be immersed in the liquid coolant. The condensation module includes a pipeline and a condensate. The pipeline passes through the box body and is adapted for the condensate to flow. At least one parameter of the condensate may be changed to lower the boiling point of the coolant to a predetermined value by lowering the temperature in the box body with the condensate.

In an embodiment of the disclosure, the parameter is a flow rate of the condensate.

In an embodiment of the disclosure, the parameter is an initial temperature of the condensate.

In an embodiment of the disclosure, the parameter is a type of condensate.

In an embodiment of the disclosure, the electronic apparatus further includes a pressure control module. The pressure control module includes a heating unit and a pressure relief valve. The heating unit is adapted to heat the coolant in the box body for releasing an air dissolved in the liquid coolant from the liquid coolant. The pressure relief valve is adapted to discharge the released air out of the box body.

In an embodiment of the disclosure, the pressure control module includes a gas detection unit. The gas detection unit is disposed out of the box body and corresponds to the pressure relief valve. Closing of the pressure relief valve corresponds to detecting the gaseous coolant by the gas detection unit.

In the operating method of the electronic apparatus of the disclosure, the electronic apparatus includes at least one heat generating component and an immersion cooling system. A condensation module of the immersion cooling system includes a pipeline and a condensate. The pipeline passes through the box body and is adapted for the condensate to flow. The method includes the following steps. A box body of the immersion cooling system accommodates a coolant. The heat generating component is disposed in the box body to be immersed in the liquid coolant. At least one parameter of the condensate is changed to lower the boiling point of the coolant to a predetermined value by lowering the temperature in the box body with the condensate.

In an embodiment of the disclosure, the parameter is a flow rate of the condensate.

In an embodiment of the disclosure, the parameter is an initial temperature of the condensate.

In an embodiment of the disclosure, the parameter is a type of condensate.

In an embodiment of the disclosure, the electronic apparatus further includes a pressure control module. The pressure control module includes a heating unit and a pressure relief valve. The method further includes the following steps. The coolant in the box body is heated by the heating unit for releasing an air dissolved in the liquid coolant from the liquid coolant. The released air is discharged out of the box body by the pressure relief valve.

In an embodiment of the disclosure, the pressure control module includes a gas detection unit. The gas detection unit is disposed out of the box body and corresponds to the pressure relief valve. The method further includes the following steps. Closing of the pressure relief valve corresponds to detecting the gaseous coolant by the gas detection unit.

DESCRIPTION OF THE EMBODIMENTS

Figure 1:
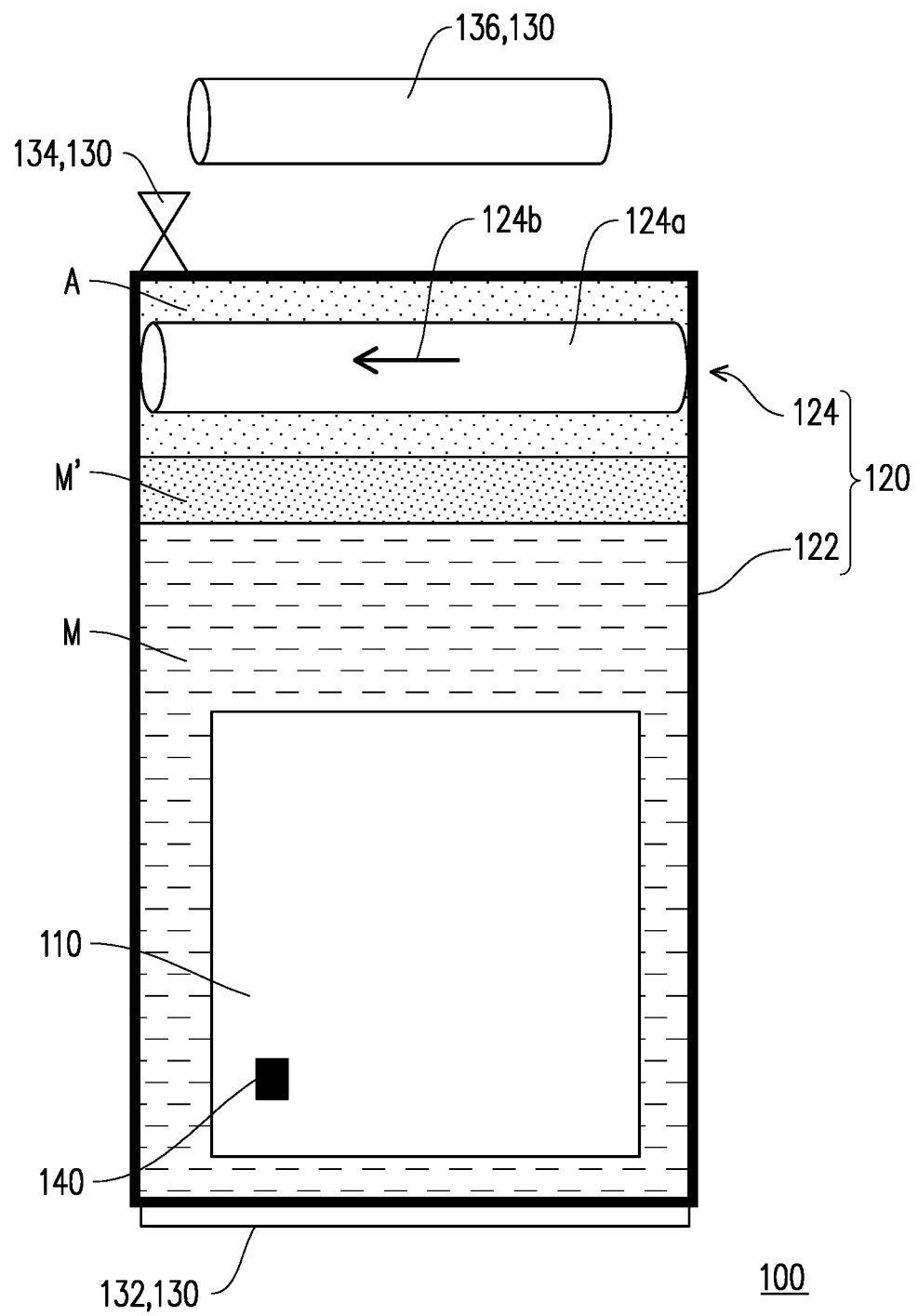
FIG. 1 is a schematic diagram of an electronic apparatus according to an embodiment of the disclosure.

FIG. 1 is a schematic diagram of an electronic apparatus according to an embodiment of the disclosure. With reference to FIG. 1, an electronic apparatus 100 of this embodiment is, for example, a server and includes at least one heat generating component 110 and an immersion cooling system 120. The immersion cooling system 120 includes a box body 122 and a condensation module 124. The box body 122 is adapted to accommodate a coolant (illustrated as a liquid coolant M and a gaseous coolant M'). The heat generating component 110 is, for example, a motherboard, and is arranged in the box body 122 to be immersed in the liquid coolant M. The condensation module 124 includes a pipeline 124a and a condensate 124b. The pipeline 124a passes through the box body 122, and the condensation module 124 drives the condensate 124b to flow in the pipeline 124a.

The coolant is, for example, dielectric solution which is liquid at room temperature, such as fluorinated liquid with a boiling point between 40 and 60 degrees Celsius or other appropriate coolant. The disclosure is not limited thereto. The liquid coolant M absorbs the heat generated by a central processing unit or other type of chips on the heat generating component 110 to lower the temperature of the heat generating component 110, and rapidly boils and vaporizes into the gaseous coolant M' with the heat generated by the heat generating component 110. When the gaseous coolant M' of high heat energy flows to the pipeline 124a in the sealed box body 122, the gaseous coolant M' is cooled by the low-temperature condensate 124b flowing in the pipeline 124a and thereby condenses into liquid on the pipeline 124a. After absorbing the heat energy from the coolant, the condensate 124b in the pipeline 124a flows out of the box body 122 to be cooled by heat exchange, and the cooled condensate 124b flows back into the box body 122 through the pipeline 124a to maintain continuous circulation. On the other hand, droplets of the coolant condensing on the pipeline 124a fall back into the liquid coolant M in the box body 122 by gravity, achieving an effect of heat dissipation with this circulation. In FIG. 1 and subsequent similar drawings, the pipeline 124a only schematically illustrates an inner circulation in the box body 122, but the pipeline 124a actually includes an outer circulation extending out of the box body 122.

In this embodiment, parameters of the condensate 124b in the pipeline 124a may be adjusted by the condensation module 124 to further have a function of adjusting a boiling point of the coolant. Specifically, at least one parameter of the condensate 124b (such as a flow rate, an initial temperature, and/or a type of the condensate 124b) may be changed to lower the boiling point of the coolant to a predetermined value by lowering the temperature in the box body 122 with the condensate 124b. Accordingly, efficiency of the coolant absorbing the heat of the heat generating component 110 for vaporization may be increased, thereby enhancing thermal energy dissipation capacity of the coolant. In this way, it is not necessary to replace the coolant with a different one to improve the thermal energy dissipation capacity of the coolant, and the operating cost of the electronic apparatus 100 may be saved.

Figure 2:
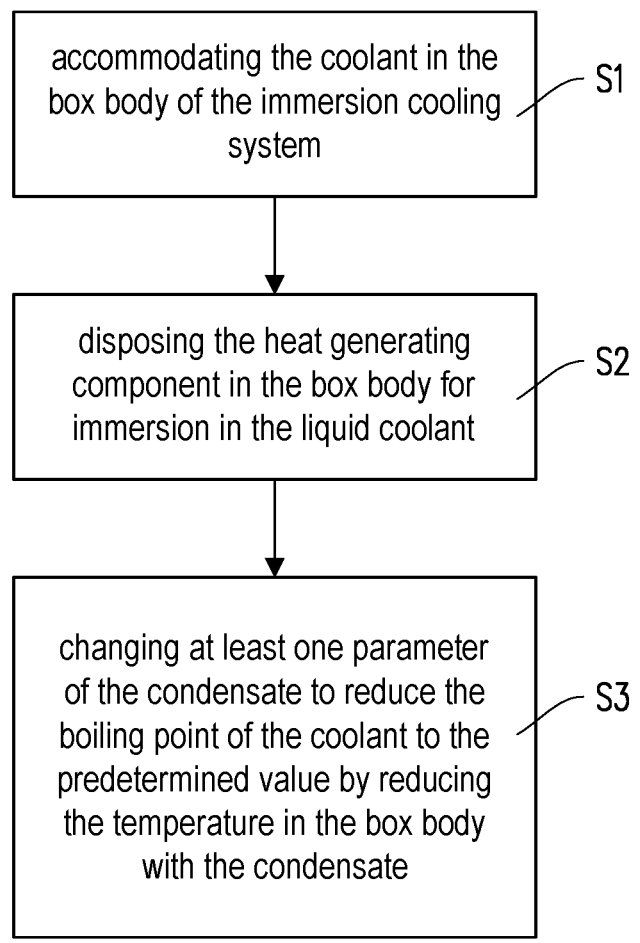
FIG. 2 is an operating flowchart of the electronic apparatus in FIG. 1.

The operating flow of the electronic apparatus 100 is described below with reference to FIG. 2. FIG. 2 is an operating flowchart of the electronic apparatus in FIG. 1. First, the box body 122 of the immersion cooling system 120 accommodates the coolant (step S1). Next, the heat generating component 110 is disposed in the box body 122 to be immersed in the liquid coolant M (step S2). At least one parameter of the condensate 124b (which may be the flow rate, the initial temperature, and/or the type of the condensate 124b as described above) is changed to lower the boiling point of the coolant to the predetermined value by lowering the temperature in the box body 122 with the condensate 124b (step S3).

Furthermore, the electronic apparatus 100 of this embodiment further includes a pressure control module 130, which includes a heating unit 132, a pressure relief valve 134, and a gas detection unit 136. The heating unit 132 is, for example, disposed at the bottom of the box body 122. The pressure relief valve 134 is, for example, disposed on the top of the box body 122. The gas detection unit 136 is disposed out of the box body 122 and corresponds to the pressure relief valve 134.

Figure 3A:
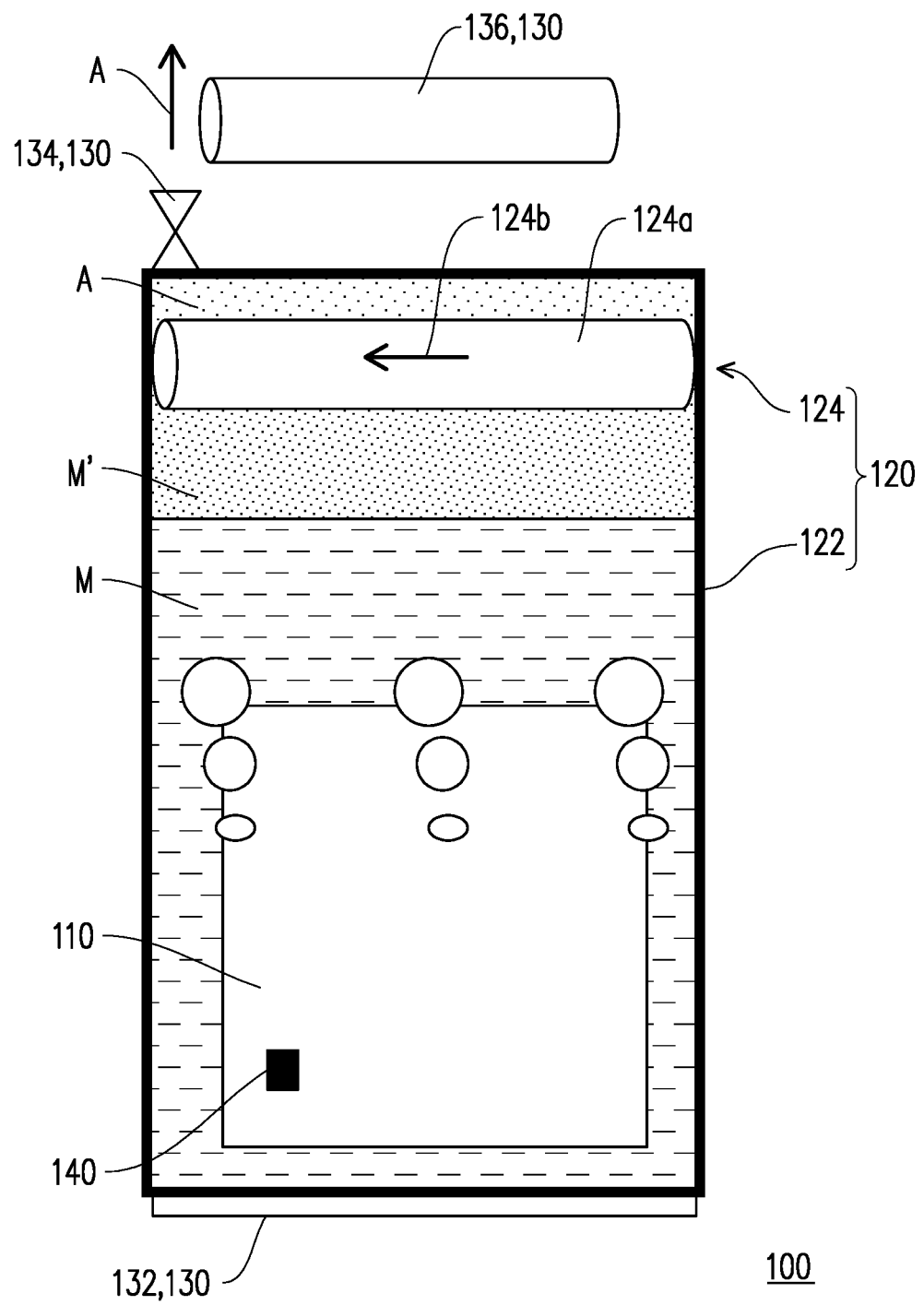
FIG. 3A and FIG. 3B illustrate how a pressure control module in FIG. 1 functions.
Figure 3B:
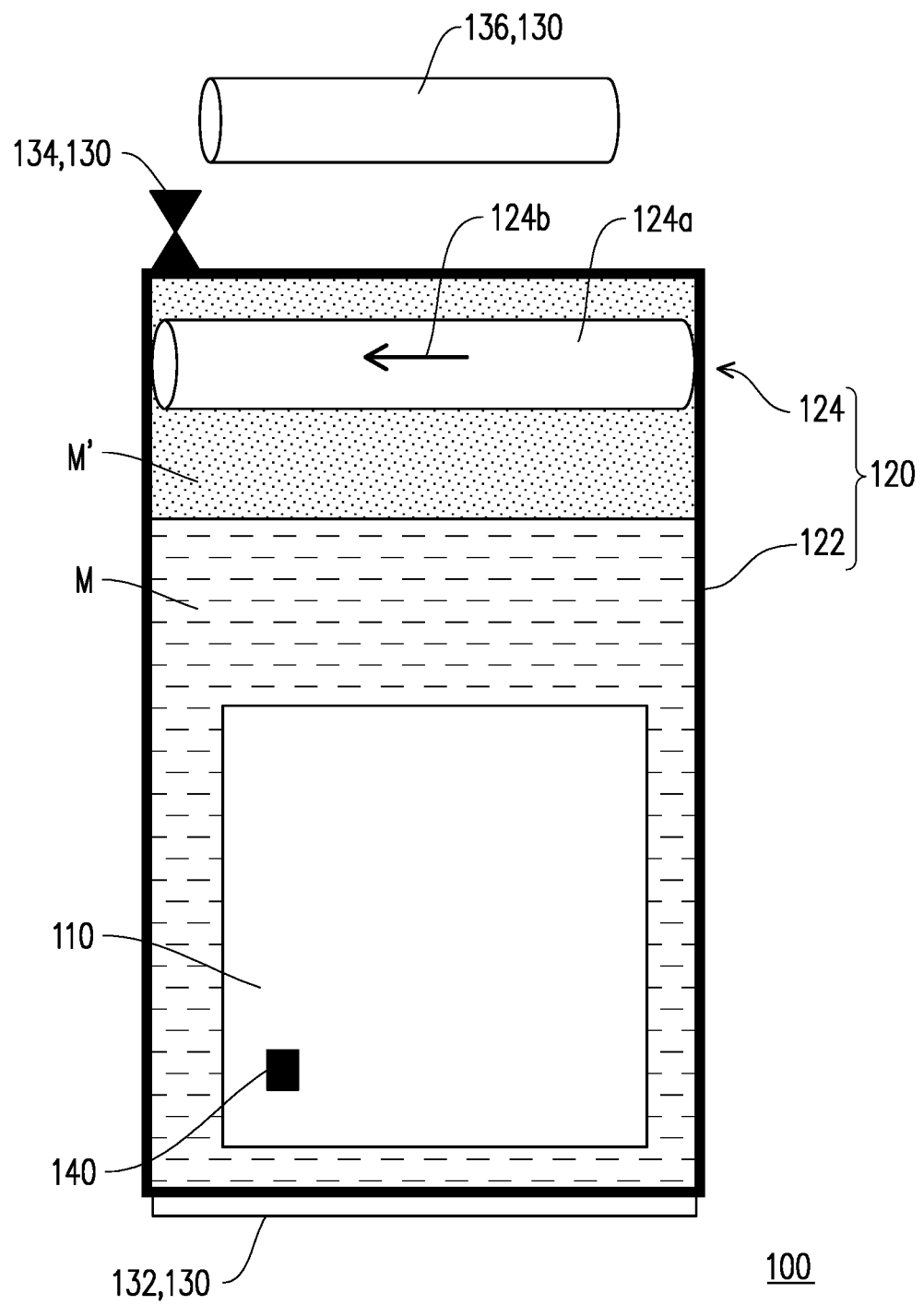

FIG. 3A and FIG. 3B illustrate how the pressure control module in FIG. 1 functions. Since the solubility of air in water is roughly inversely proportional to the temperature, the heating unit 132 may heat the coolant M in the box body 122 as shown in FIG. 3A to release the air dissolved in the liquid coolant M from the liquid coolant M. The pressure relief valve 134 is adapted to discharge air A which is released out of the box body 122. During the process of heating, the box body 122 is, for example, heated to 50 degrees Celsius. During the process of discharging the air A, since the density of the air A is less than that of the gaseous coolant M', the air A is located above the gaseous coolant M' all the time and is discharged first. Moreover, the volume of the gaseous coolant M' in the box body 122 increases as the pressure in the box body 122 lowers as shown in FIG. 3A. When the gas detection unit 136 detects the gaseous coolant M', it means that the air A in the box body 122 has been substantially completely discharged, and the gas in the box body 122, as shown in FIG. 3B, substantially only contains the gaseous coolant M' without the air A, and the pressure of the gaseous coolant M' in the box body 122 is substantially the same as an external pressure (for example, 1 atmosphere). At this time, the pressure relief valve 134 and the heating unit 132 may be closed to naturally cool the box body 122 (for example, from 50 degrees Celsius to 25 degrees Celsius) so that its internal pressure is lowered to be less than the external pressure (for example, from 1 atmosphere to 0.3 atmosphere) for the box body 122 to be in a negative pressure state. That is, closing of the pressure relief valve 134 corresponds to detecting the gaseous coolant M' by the gas detection unit 136.

In addition, when the gas in the box body 122 does not contain the air, but only the gaseous coolant M' as shown in FIG. 3B, the temperature in the box body 122 is equal to the boiling point of the coolant. Based on this, in step S3 of FIG. 2, for example, the temperature in the box body 122 of FIG. 3B that has been depressurized is lowered to effectively lower the boiling point of the coolant to the predetermined value.

In detail, a formula for heat exchange duty is $Q=U*A*LMTD$, where Q is heat exchange duty, U is a heat transfer coefficient (which rises with an increase of the condensate flow rate), A is heat exchange area, and LMTD is logarithmic mean temperature difference. According to this formula, when the heat exchange duty Q and the heat exchange area A are fixed, increasing the flow rate of the condensate 124b may lower the logarithmic mean temperature difference LMTD, so that the temperature in the box body 122 is lowered, meaning that the boiling point of the coolant is lowered as well. In addition, a thermal resistance R between the liquid coolant M and the heat generating component 110 immersed therein is equal to $(T1-T2)/W$, where T1 is the temperature of the heat generating component, T2 is the boiling point of the coolant, and W is a power of the heat generating component. In light of the above, when the thermal resistance R is fixed, the lower the boiling point T2 of the coolant, the greater the power W of the heat generating component that may be heat-dissipated by the coolant.

Figure 4:
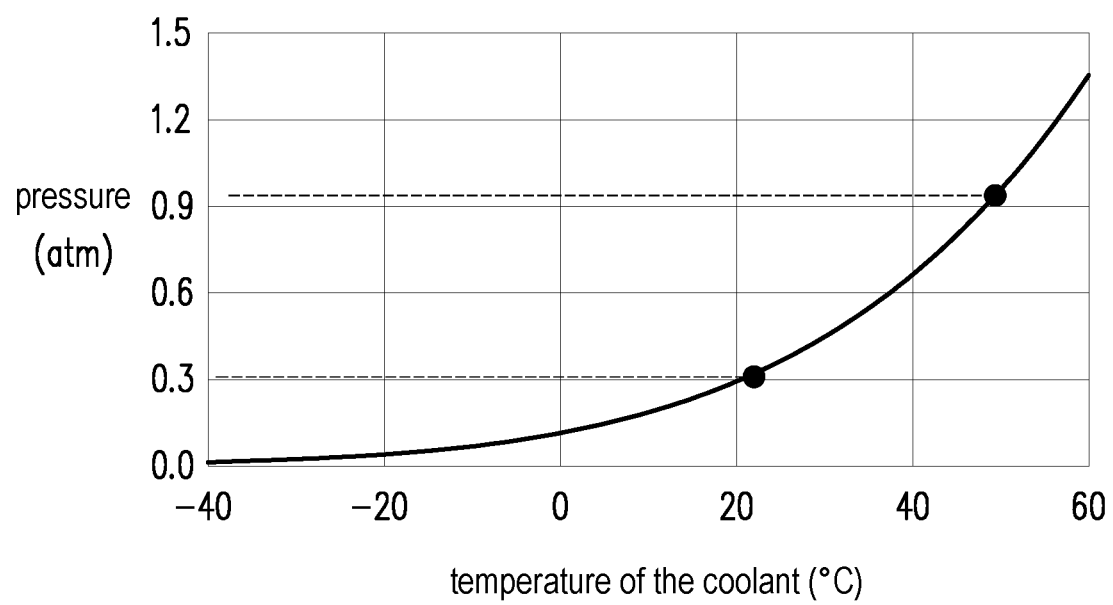
FIG. 4 illustrates a relationship between a saturation pressure and a temperature of a coolant in FIG. 3B.

FIG. 4 illustrates a relationship between a saturation pressure and a temperature of the coolant in FIG. 3B. For example, according to the relationship between the thermal resistance R, the temperature T1 of the heat generating component, the boiling point T2 of the coolant, and the power W of the heat generating component mentioned above, if the temperature T1 of the heat generating component is 75 degrees Celsius and the thermal resistance R is 0.05, the coolant at 50 degrees Celsius shown in FIG. 4 (with its saturation pressure of about 0.9 atmospheres) may dissipate the thermal energy of the heat generating component having a power of 500 watts, and the coolant cooled to 20 degrees Celsius (with its saturation pressure of about 0.3 atmospheres) may dissipate the thermal energy of the heat generating component having a power of 1100 watts.

In addition, as described above, the air dissolved in the coolant M is released and discharged out of the box body 122 in advance by heating the coolant M. This may avoid the air dissolved in the coolant M from being released as late as when the coolant M is heat-dissipating the heat generation component 110 and thereby increasing the internal pressure of the box body 122. In this way, the gaseous coolant M' is not prone to be diffused outside due to the increase of pressure.

Figure 5:
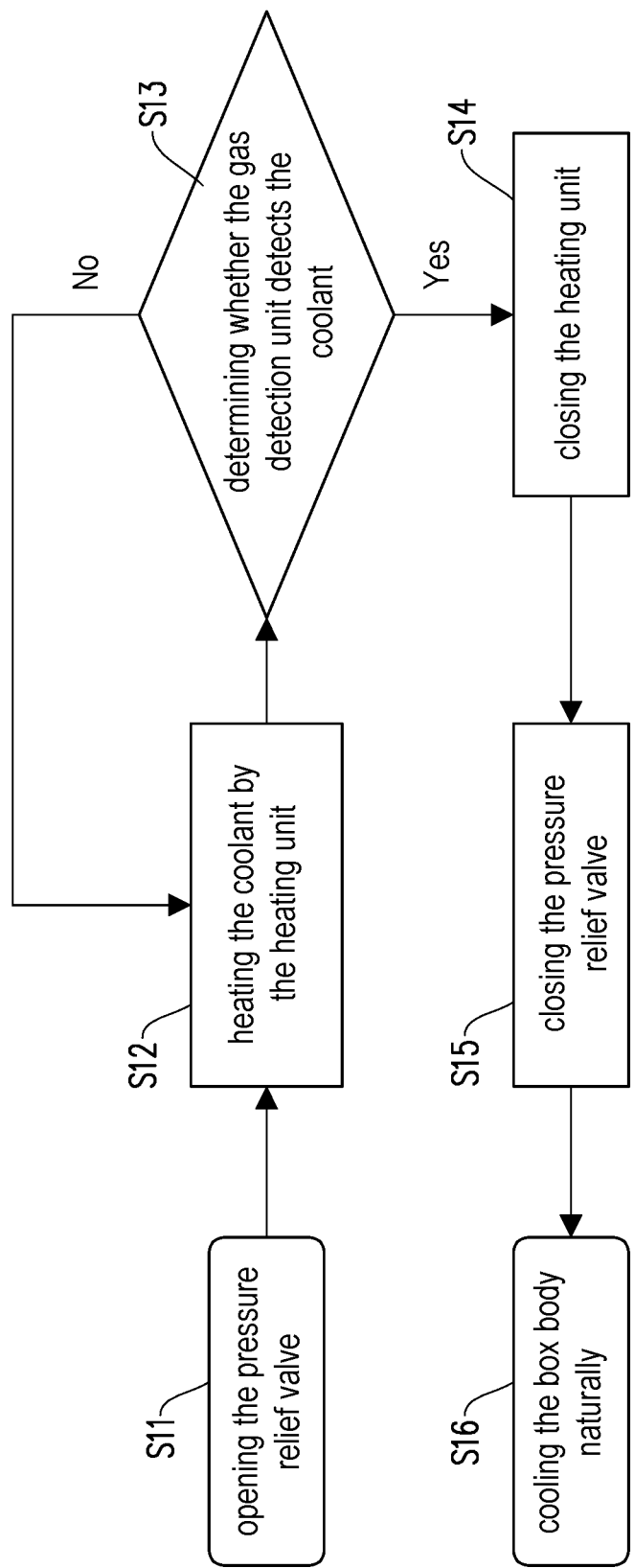
FIG. 5 illustrates operating steps of the pressure control module in FIG. 1.

Specific operating steps of the pressure control module 130 of this embodiment are exemplified below. FIG. 5 illustrates the operating steps of the pressure control module in FIG. 1. With reference to FIG. 5, first, the pressure relief valve 134 is opened (step S11). Next, the coolant M is heated by the heating unit 132 (step S12). It is determined whether the gas detection unit 136 detects the coolant M' (step S13). If the gas detection unit 136 does not detect the coolant M', the flow returns to step S12. If the gas detection unit 136 detects the coolant M', the heating unit 132 is closed (step S14), the pressure relief valve 134 is closed (step S15), and the box body 122 is allowed to cool naturally (step S16).

Figure 6:
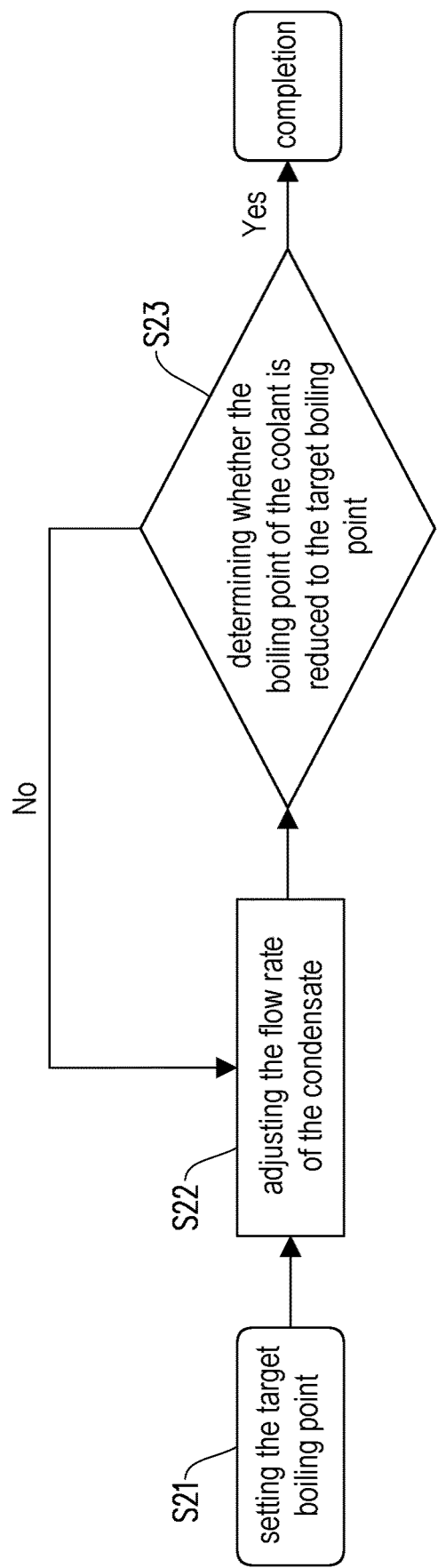
FIG. 6 illustrates operating steps of lowering a boiling point of the coolant by a condensation module in FIG. 3B.

Specific operating steps for lowering the boiling point of the coolant by the condensation module 124 of this embodiment are exemplified below. FIG. 6 illustrates the operating steps of lowering the boiling point of the coolant by the condensation module in FIG. 3B. With reference to FIG. 6, first, a target boiling point is set (step S21). Next, the flow rate of the condensate 124b is adjusted (step S22). A temperature sensor 140 is used to determine whether the boiling point of the coolant is lowered to the target boiling point (step S23). If the boiling point of the coolant is not lowered to the target boiling point, the flow returns to step S22. If the boiling point of the coolant is lowered to the target boiling point, the operation is completed.

Figure 7:
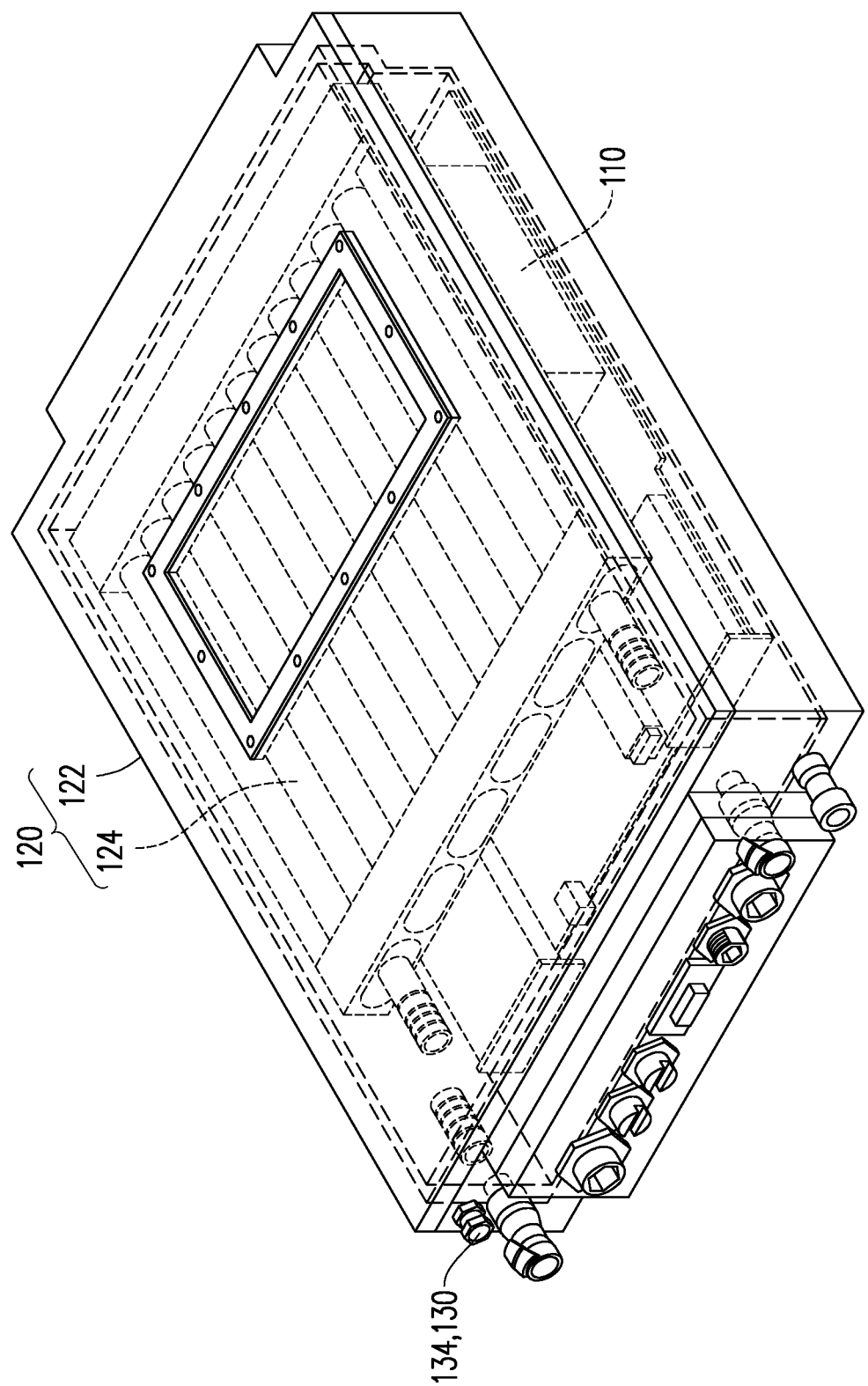
FIG. 7 illustrates a partial structure of an electronic apparatus according to an embodiment of the disclosure.

The electronic apparatus 100 shown in FIG. 1 is only exemplary, and the disclosure does not limit the specific structure of the electronic apparatus 100. The structure is exemplified by drawings below. FIG. 7 illustrates a partial structure of an electronic apparatus according to an embodiment of the disclosure. As shown in FIG. 7, the heat generating component 110 and the condensation structure 124 are stacked in the box body 122 in the thickness direction of the box body 122, and the pressure relief valve 134 is located on the upper part of the side wall of the box body 122. In other embodiments, the electronic apparatus 100 may be of other suitable types.

In summary, the disclosure lowers the boiling point of the coolant by changing the parameter of the condensate to increase the efficiency of the coolant absorbing the heat of the heat generating component for vaporization, thereby enhancing the thermal energy dissipation capacity of the coolant. In this way, it is not necessary to replace the coolant with a different one to improve the thermal energy dissipation capacity of the coolant, and the operating cost of the electronic apparatus may be saved. In addition, before lowering the boiling point of the coolant by changing the parameter of the condensate as described above, the air dissolved in the coolant may be released and discharged out of the box body in advance by heating the coolant, so that the box body does not contain the air, in order to effectively lower the boiling point of the coolant to the predetermined value with the decrease of the temperature in the box body. Moreover, as described above, the air dissolved in the coolant is released and discharged out of the box body in advance by heating the coolant. This may avoid the air dissolved in the coolant from being released as late as when the coolant is heat-dissipating the heat generation component and thereby increasing the internal pressure of the box body. In this way, the gaseous coolant is not prone to be diffused outside due to the increase of pressure.

What is claimed is:

1. An immersion cooling system, comprising:
a box body, adapted to accommodate a coolant;
a condensation module, driving a condensate and adjusting at least one parameter of the condensate to lower a temperature in the box body; and
a pressure control module, comprising a heating unit and a pressure relief valve, wherein the heating unit is adapted to heat the coolant in the box body for releasing an air dissolved in the coolant in a liquid state from the coolant in the liquid state, and the pressure relief valve is adapted to discharge the air to an outside of the box body.

2. The immersion cooling system according to claim 1, wherein the at least one parameter is a flow rate of the condensate.

3. The immersion cooling system according to claim 1, wherein the at least one parameter is an initial temperature of the condensate.

4. The immersion cooling system according to claim 1, wherein the at least one parameter is a type of the condensate.

5. The immersion cooling system according to claim 1, wherein the pressure control module comprises a gas detection unit, the gas detection unit is disposed out of the box body and corresponds to the pressure relief valve, and closing of the pressure relief valve corresponds to detecting the coolant in a gaseous state by the gas detection unit.

6. The immersion cooling system according to claim 1, wherein the condensation module comprises a pipeline and a condensate, and the pipeline passes through the box body and is adapted for the condensate to flow.

7. The immersion cooling system according to claim 1, wherein the condensation module lowers a boiling point of the coolant to a predetermined value by lowering a temperature in the box body with the condensate.

8. An electronic apparatus, comprising:
at least one heat generating component, and
an immersion cooling system, comprising:
a box body, adapted to accommodate a coolant, wherein the at least one heat generating component is disposed in the box body to be immersed in the coolant in a liquid state;
a condensation module, comprising a pipeline and a condensate, wherein the pipeline passes through the box body and is adapted for the condensate to flow, and at least one parameter of the condensate may be changed to lower a boiling point of the coolant to a predetermined value by lowering a temperature in the box body with the condensate; and
a pressure control module, comprising a heating unit and a pressure relief valve, wherein the heating unit is adapted to heat the coolant in the box body for releasing an air dissolved in the coolant in a liquid state from the coolant in the liquid state, and the pressure relief valve is adapted to discharge the air to an outside of the box body.

9. The electronic apparatus according to claim 8, wherein the at least one parameter is a flow rate of the condensate.

10. The electronic apparatus according to claim 8, wherein the at least one parameter is an initial temperature of the condensate.

11. The electronic apparatus according to claim 8, wherein the at least one parameter is a type of the condensate.

12. The electronic apparatus according to claim 8, wherein the pressure control module comprises a gas detection unit, the gas detection unit is disposed out of the box body and corresponds to the pressure relief valve, and closing of the pressure relief valve corresponds to detecting the coolant in a gaseous state by the gas detection unit.

13. An operating method of an electronic apparatus, wherein the electronic apparatus comprises at least one heat generating component and an immersion cooling system, a condensation module of the immersion cooling system comprises a pipeline and a condensate, the pipeline passes through a box body and is adapted for the condensate to flow, the immersion cooling system comprises a pressure control module, the pressure control module comprises a heating unit and a pressure relief valve, and the operating method comprises:
accommodating a coolant in the box body of the immersion cooling system;
disposing the at least one heat generating component in the box body for immersion in the coolant in a liquid state;
changing at least one parameter of the condensate to lower a boiling point of the coolant to a predetermined value by lowering a temperature in the box body with the condensates;
heating the coolant in the box body by the heating unit for releasing an air dissolved in the coolant in the liquid state from the coolant in the liquid state; and
discharging the air to an outside of the box body by the pressure relief valve.

14. The operating method of the electronic apparatus according to claim 13, wherein the at least one parameter is a flow rate of the condensate.

15. The operating method of the electronic apparatus according to claim 13, wherein the at least one parameter is an initial temperature of the condensate.

16. The operating method of the electronic apparatus according to claim 13, wherein the at least one parameter is a type of the condensate.

17. The operating method of the electronic apparatus according to claim 13, wherein the pressure control module comprises a gas detection unit, the gas detection unit is disposed out of the box body and corresponds to the pressure relief valve, and the operating method further comprises:
closing the pressure relief valve in correspondence with detecting the coolant in a gaseous state by the gas detection unit.

\* \* \* \* \*